(12) United States Patent
Endo et al.

(10) Patent No.: US 7,943,285 B2
(45) Date of Patent: May 17, 2011

(54) PATTERN FORMATION METHOD

(75) Inventors: Masayuki Endo, Osaka (JP); Masaru Sasago, Osaka (JP)

(73) Assignee: Panasonic Corporation, Osaka (JP)

( * ) Notice: Subject to any disclaimer, the term of this patent is extended or adjusted under 35 U.S.C. 154(b) by 347 days.

(21) Appl. No.: 12/029,944

(22) Filed: Feb. 12, 2008

(65) Prior Publication Data

US 2008/0227038 A1     Sep. 18, 2008

(30) Foreign Application Priority Data

Mar. 13, 2007  (JP) ................................. 2007-063171
Oct. 4, 2007   (JP) ................................. 2007-261034

(51) Int. Cl.
*G03F 7/26* (2006.01)
(52) U.S. Cl. ......... 430/313; 430/316; 430/394; 430/312
(58) Field of Classification Search .................. 430/313, 430/316, 323, 394, 324, 312, 311
See application file for complete search history.

(56) References Cited

U.S. PATENT DOCUMENTS

| | | | | |
|---|---|---|---|---|
| 2005/0266342 A1* | 12/2005 | Kim et al. | ................. | 430/270.1 |
| 2006/0014106 A1* | 1/2006 | Hatakeyama et al. | ........ | 430/311 |
| 2006/0105272 A1* | 5/2006 | Gallagher et al. | ............ | 430/311 |
| 2006/0160028 A1* | 7/2006 | Lee et al. | ....................... | 430/312 |
| 2006/0231524 A1* | 10/2006 | Liu et al. | ........................ | 216/41 |
| 2007/0287105 A1* | 12/2007 | Ito et al. | ........................ | 430/346 |
| 2008/0299494 A1* | 12/2008 | Bencher et al. | ................ | 430/313 |

OTHER PUBLICATIONS

Maenhoudt, M. et al., "Double Patterning scheme for sub-0.25 k1 single damascene structures at NA=0.75, λ=193nm," Optical Microlithography XVIII, vol. 5754, pp. 1508-1518, Bellingham, WA 2005.

* cited by examiner

*Primary Examiner* — Kathleen Duda
*Assistant Examiner* — Caleen O Sullivan
(74) *Attorney, Agent, or Firm* — McDermott Will & Emery LLP

(57) ABSTRACT

After formation of an underlayer film and an intermediate layer film, a resist pattern formed by the first pattern exposure with the first resist film and the second pattern exposure with the second resist film is transferred to the intermediate layer film. The underlayer film is etched using an intermediate layer pattern as a mask to form an underlayer film pattern. Herein, the first and second resist films are chemically amplified resist films. The second resist film contains a greater amount of additive which improves the sensitivity of the resist or which improves the alkaline solubility of resist exposed part.

20 Claims, 11 Drawing Sheets 206a
202b
201

202b
201

202b
201

PATTERN FORMATION METHOD

BACKGROUND OF THE INVENTION

1. Field of the Invention

The present invention relates to a pattern formation method employed in manufacture of semiconductor devices, or the like, and specifically to a pattern formation method based on a double patterning technique.

2. Description of the Prior Art

Large-scale integration and downsizing of a semiconductor device has been demanding acceleration of development in lithography techniques. Presently, pattern formation is realized by means of photolithography using a mercury lamp, KrF excimer laser, ArF excimer laser, or the like, as a light source. The use of $F_2$ laser with shorter wavelengths was once studied, but the study and development have been stopped as of now due to difficulties in exposure systems and resist materials.

Under such circumstances, a patterning method called "double patterning" has been proposed recently for improvements in miniaturization with conventional exposure wavelengths. This method realizes a desired mask pattern by two separate photomasks for exposure, thereby achieving an improved pattern contrast.

The resolution of lithography is defined by $k_1 \cdot \lambda/NA$ ($k_1$: process constant, $\lambda$: exposure wavelength, NA: numerical aperture of exposure system). The double patterning can greatly improve the resolution even with the same exposure wavelength because improvements in the pattern contrast greatly decrease the value of $k_1$.

Hereinafter, a pattern formation method based on the conventional double patterning is described with reference to FIG. 8A to FIG. 10B.

Referring to FIG. 8A, a hardmask (e.g., silicon nitride film) 202 is first formed on a semiconductor substrate 201 so as to have a thickness of about 0.12 μm.

Then, referring to FIG. 8B, a first ArF resist film 203 is formed on the hardmask 202 so as to have a thickness of about 0.15 μm. Thereafter, the first exposure is carried out via a first photomask 204 with light 205 from an ArF excimer laser having NA of 0.85. After the first exposure, the first ArF resist film 203 is heated by a hotplate to about 105° C. for 60 seconds.

Then, referring to FIG. 8C, a first resist pattern 203a is formed by developing the first ArF resist film 203 with 2.38 wt % tetramethylammonium hydroxide developer solution.

Then, referring to FIG. 8D, a first hardmask pattern 202a is formed by etching the hardmask 202 with a fluoric gas, or the like, using the first resist pattern 203a as a mask.

Then, referring to FIG. 9A, the first resist pattern 203a is removed by ashing with oxygen plasma. Thereafter, referring to FIG. 9B, a second ArF resist film 206 is formed on the first hardmask pattern 202a so as to have a thickness of about 0.15 μm.

Then, referring to FIG. 9C, the second exposure is carried out via a second photomask 207 with light 205 from an ArF excimer laser having NA of 0.85. After the second exposure, the second ArF resist film 206 is heated by the hotplate to about 105° C. for 60 seconds.

Then, referring to FIG. 9D, a second resist pattern 206a is formed by developing the second ArF resist film 206 with 2.38 wt % tetramethylammonium hydroxide developer solution.

Then, referring to FIG. 10A, the hardmask 202 is etched with a fluoric gas, or the like, using the second resist pattern 206a as a mask. Then, referring to FIG. 10B, the second resist pattern 206a is removed by ashing with oxygen plasma such that a second hardmask pattern 202b is formed.

With such two-step resist exposure and hardmask etching, the finer second hardmask pattern 202b is obtained. For example, the semiconductor substrate 201 (or a film to be etched (not shown) overlying the semiconductor substrate 201) is dry-etched using the second hardmask pattern 202b formed by double patterning as shown in FIG. 11, whereby the semiconductor substrate 201 (or film to be etched) is microprocessed.

In the second application of the material for the second ArF resist film 206 on the first hardmask pattern 202a, large irregularities over the surface of the underlying first hardmask pattern 202a could deteriorate the application characteristics. In such a case, the resolution of the second resist exposure would deteriorate, so that even the double patterning could not achieve a sufficient resolution.

A solution to such a problem disclosed in M. Maenhoudt et al., "Double Patterning scheme for sub-0.25 k1 single damascene structures at NA=0.75, λ=193 nm", Proc. SPIE, vol. 5754, 1508 (2005) is to planarize the first hardmask pattern 202a with BARC (Bottom Anti-Reflection Coating).

Specifically, referring to FIG. 12, BARC 208 is applied over the first hardmask pattern 202a to form a flat surface, on which the second ArF resist film 206 is formed. In this way, the application characteristics are improved. This technique can prevent deterioration in resolution of the second resist exposure.

SUMMARY OF THE INVENTION

Although as described above introduction of the planarizing process with BARC can prevent deterioration in resolution of the second resist exposure, the present inventors found the demerits described below in the study of pattern formation based on double patterning. Hereinafter, the demerits are described with reference to FIG. 13A and FIG. 13C.

FIG. 13A through FIG. 13C are cross-sectional views showing the steps from formation of the first hardmask pattern 202a by the first pattern exposure to formation of the second resist pattern 206a by the second pattern exposure. FIG. 13A corresponds to FIG. 9A, FIG. 13B corresponds to FIG. 9C, and FIG. 13C corresponds to FIG. 9D.

Since the first resist pattern 203a formed by the first pattern exposure is removed by ashing with oxygen plasma, the surface of the first hardmask pattern 202a is exposed to the oxygen plasma as shown in FIG. 13A (because the first resist pattern 203a cannot be removed completely without overashing). Thus, the first hardmask pattern 202a has a surface roughened by ashing.

If the resultant structure with the roughened surface is subjected to the second pattern exposure as shown in FIG. 13B, acid produced at exposed portions (206b) of the second resist film 206 are introduced and unreleasably caught in, i.e., entrapped in, the cavities of the roughened surface of the first hardmask pattern 202a, so that the function of the acid is marred. As a result, when the second resist film 206 is developed as shown in FIG. 13C, there is a possibility that unsatisfactory pattern formation, e.g., wobbling pattern edges, or variations in dimensions occur due to a deficient amount of acid in the exposed portions (206b).

Occurrence of such unsatisfactory pattern formation due to the roughened surface of the first hardmask pattern 202a is an unavoidable, inherent problem in double patterning with a chemically amplified resist.

The present invention was conceived in view of the above-described knowledge. A primary objective of the present invention is to provide a pattern formation method which is free from the above-described problems inherent in double patterning and which is capable of forming a fine pattern having a desirable shape.

Double patterning refers to a patterning process wherein resist pattern exposure is carried out in two separate steps. Typically, the same resist material designed for the purpose of forming desirable patterns is used in both pattern exposure steps.

The above-described problems inherent in double patterning, for example, a pattern error due to a roughened surface of the first hardmask pattern 202a, occur in the second pattern exposure. In view of this, the present inventors conceived the present invention.

Thus, according to a pattern formation method of the present invention, at least one of an additive which improves sensitivity of the resist and an additive which improves alkaline solubility of exposed part of the resist is contained in a greater amount in the second resist film for the second pattern exposure than in the first resist film for the first pattern exposure.

In the second pattern exposure, the exposed part of the second resist film overlies the intermediate layer pattern which has a roughened surface (see FIG. 13B), part of the acid produced by exposure is entrapped so that the acid is deficient. This means that the exposed part of the second resist film has a decreased effective resist sensitivity. If the exposed part of the second resist film is developed without compensation for deficit acid, the alkaline solubility of the exposed part would effectively decrease.

In view of such, the decreased sensitivity of the second resist film as compared with the first resist film is compensated for by employing a construction where the second resist film for the second pattern exposure contains a greater amount of additive which improves the sensitivity of the resist than the first resist film for the first pattern exposure. An effect equivalent to this can also be achieved. The decreased alkaline solubility of the second resist film as compared with the first resist film is compensated for by employing a construction where the second resist film for the second pattern exposure contains a greater amount of additive which improves the alkaline solubility of the resist exposed part than the first resist film for the first pattern exposure. Thus, such countermeasures can effectively prevent occurrence of pattern error in the second exposure.

Specifically, in the first resist film and second resist film in which a photoacid generator is contained as an additive, a greater amount of the photoacid generator is contained in the second resist film than in the first resist film, whereby the sensitivity of the second resist film is higher than that of the first resist film. This is because deficiency of acid in exposed parts of the second resist film is directly compensated for by acid produced from the abundantly-contained photoacid generator.

When the first resist film and the second resist film contain as an additive a base which functions as a quencher for the photoacid generator, the sensitivity of the first resist film is higher than that of the second resist film by employing a construction where a smaller amount of base is contained in the second resist film than in the first resist film. This is because deficiency of acid in exposed parts of the second resist film is indirectly compensated for by the inadequately-contained base.

When the second resist film contains 2-nitrobenzyl ether while the first resist film does not, the alkaline solubility of the second resist film is higher than that of the first resist film. This is because OH-base produced from 2-nitrobenzyl ether by exposure improves the alkaline solubility of the exposed parts.

A pattern formation method according to the present invention includes the steps of: (a) forming an underlayer film on a substrate; (b) forming an intermediate layer film on the underlayer film; (c) forming a first resist film on the intermediate layer film and performing exposure and development of the first resist film via a first photomask having a first pattern to form a first resist pattern; (d) etching the intermediate layer film using the first resist pattern as a mask to form a first intermediate layer pattern; (e) removing the first resist film; (f) after step (e), forming a second resist film on the underlayer film and the intermediate layer pattern and performing exposure and development of the second resist film via a second photomask having a second pattern to form a second resist pattern; (g) etching the intermediate layer film using the second resist pattern as a mask to form a second intermediate layer pattern; (h) removing the second resist film; and (i) after step (h), etching the underlayer film using the second intermediate layer pattern as a mask to form an underlayer film pattern which has the first and second patterns, wherein the first resist film and the second resist film are chemically amplified resist films, and at least one of an additive which improves sensitivity of the resist and an additive which improves alkaline solubility of exposed part of the resist is contained in a greater amount in the second resist film than in the first resist film.

Herein, at least one of step (c) and step (f) may include performing an immersion exposure with a solution provided on the first resist film or the second resist film. The pattern formation method may further include the step of forming a barrier film on the first resist film or the second resist film before the immersion exposure.

According to the pattern formation method of the present invention, occurrence of pattern error inherent to double patterning due to a roughened surface of the intermediate layer pattern is effectively prevented, so that a finer pattern having a desirable shape can be formed.

BRIEF DESCRIPTION OF THE DRAWINGS

FIG. 6A cross-sectionally illustrates the step of immersion exposure in the first pattern exposure. FIG. 6B cross-sectionally illustrates the step of immersion exposure in the second pattern exposure.

FIG. 7A cross-sectionally illustrates the step of forming a barrier film before the first pattern exposure. FIG. 7B cross-sectionally illustrates the step of forming a barrier film before the second pattern exposure.

DESCRIPTION OF THE PREFERRED EMBODIMENTS

Figure 1A:
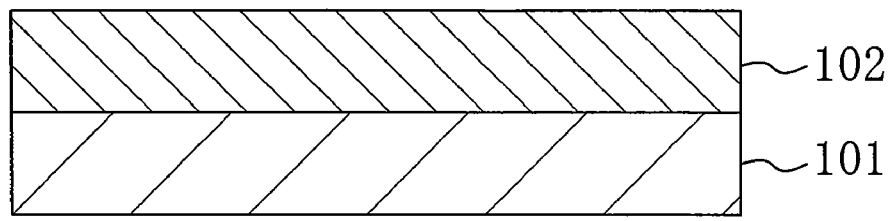
FIG. 1A through FIG. 1C cross-sectionally illustrate steps of a pattern formation method according to embodiment 1 of the present invention.

Hereinafter, embodiments of the present invention will be described with reference to the drawings. Throughout the drawings, elements having substantially the same function are denoted by the same reference numeral for simplification of illustration. It should be noted that the present invention is not limited to the embodiments described below.

Embodiment 1

A pattern formation method of the present invention is described with reference to FIG. 1A through FIG. 4B.

First, the material for the first resist film having the following composition is prepared.

| | |
|---|---|
| Poly(2-methyl-2-adamantyl methacrylate (50 mol %)-γ-butyrolactone methacrylate (40 mol %)-2-hydroxy adamantane methacrylate (10 mol %)) (base polymer) | 2 g |
| Triphenyl sulfonium trifluoromethanesulfonic acid (photoacid generator) | 0.06 g |
| Triethanolamine (quencher) | 0.002 g |
| Propylene glycol monomethyl ether acetate (solvent) | 20 g |

Also, the material for the second resist film having the following composition is prepared.

| | |
|---|---|
| Poly(2-methyl-2-adamantyl methacrylate (50 mol %)-γ-butyrolactone methacrylate (40 mol %)-2-hydroxy adamantane methacrylate (10 mol %)) (base polymer) | 2 g |
| Triphenyl sulfonium trifluoromethanesulfonic acid (photoacid generator) | 0.08 g |
| Triethanolamine (quencher) | 0.002 g |
| Propylene glycol monomethyl ether acetate (solvent) | 20 g |

Herein, the amount of the photoacid generator contained in the material for the second resist film is greater than in the material for the first resist film.

First, referring to FIG. 1A, an underlayer film 102 is formed on a semiconductor substrate 101 so as to have a thickness of about 0.7 μm. Herein, the underlayer film 102 is an organic film, which can be made of, for example, an organic material having a hydrocarbon skeleton cured by thermal crosslinking, or the like. The hydrocarbon skeleton may additionally have an alkyl group, alkenyl group, phenyl group, halogen group, or the like. Specifically, the material preferably includes a crosslinking agent of novolac resin, phenolic resin, or the like, which has an epoxy group, glycidyl group, or the like, and a thermal acid generator, such as an onium salt. Heating of the underlayer film 102 after application of the material for the underlayer film 102 on the semiconductor substrate 101 leads to generation of acid. The generated acid affects the crosslinking agent so that the crosslinking agent causes crosslinking of the resin. As a result, the underlayer film 102 becomes hard.

Figure 1B:
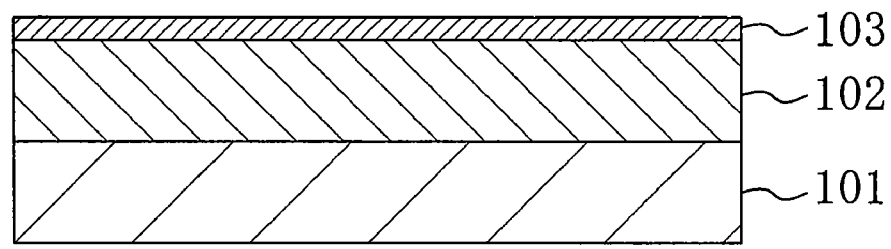

Then, referring to FIG. 1B, an intermediate layer film 103 is formed on the underlayer film 102 so as to have a thickness of about 0.08 μm. The intermediate layer film 103 functions as a hardmask. Herein, the intermediate layer film 103 can be made of, for example, a material containing silicon, such as $SiO_2$ skeleton, SiN skeleton, SiON skeleton, or the like. The skeleton may additionally have an alkyl group, alkenyl group, phenyl group, halogen group, or the like. Specifically, the intermediate layer film 103 can be made of a siloxane resin or silsesquioxane resin which may additionally have a methyl group, an ethyl group, or the like.

Figure 1C:
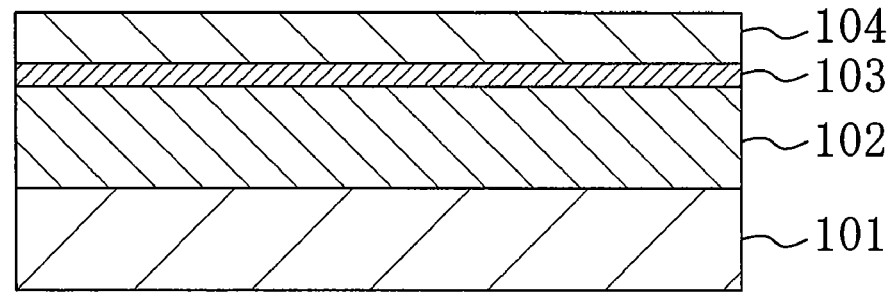

Then, referring to FIG. 1C, the material for the first resist film is applied on the intermediate layer film 103 to form a first resist film 104 having a thickness of about 0.15 μm.

Figure 2A:
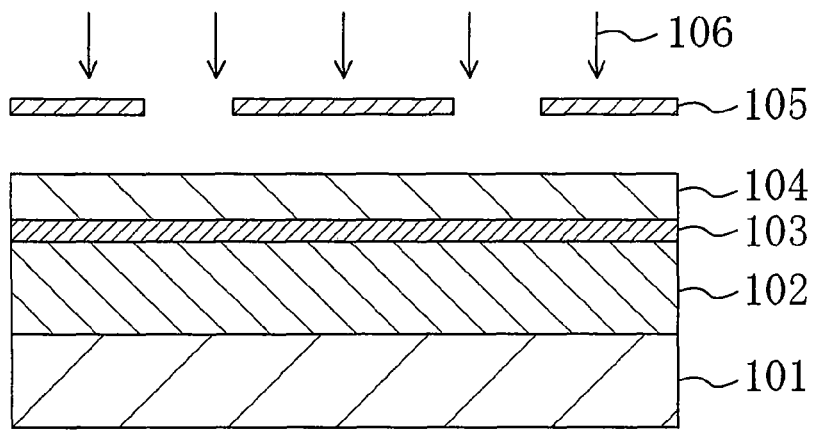
FIG. 2A through FIG. 2D cross-sectionally illustrate steps of the pattern formation method according to embodiment 1 of the present invention.

Then, referring to FIG. 2A, the first pattern exposure is carried out with light 106 from an ArF excimer laser having NA of 0.85 via a first photomask 105 having a first pattern. After the first exposure, the first resist film 104 is heated by a hotplate to about 105° C. for 60 seconds (post-exposure baking).

Figure 2B:
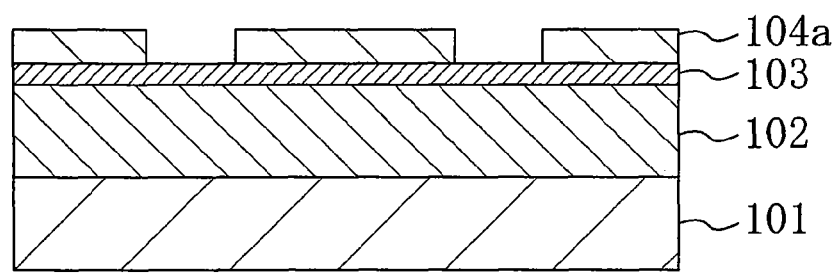

Then, referring to FIG. 2B, the baked first resist film 104 is developed using 2.38 wt % tetramethylammonium hydroxide aqueous solution (alkaline developer) to form a first resist pattern 104a which corresponds to unexposed parts of the first resist film 104.

Figure 2C:
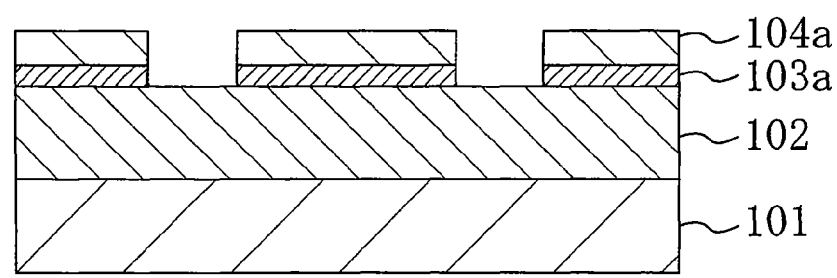
Figure 2D:
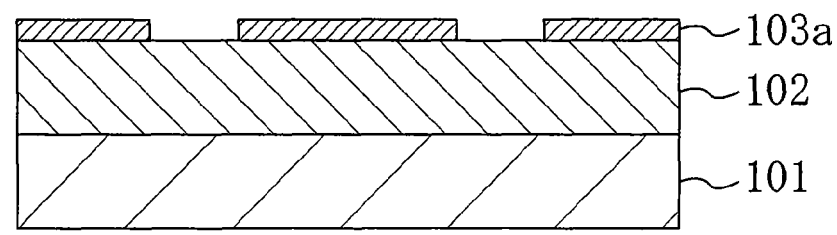

Then, referring to FIG. 2C, the first resist pattern 104a is used as a mask to etch the intermediate layer film 103 with, for example, a fluoric gas. Referring to FIG. 2D, the first resist pattern 104a is then removed by ashing with oxygen plasma such that a first intermediate layer pattern 103a is formed.

Figure 3A:
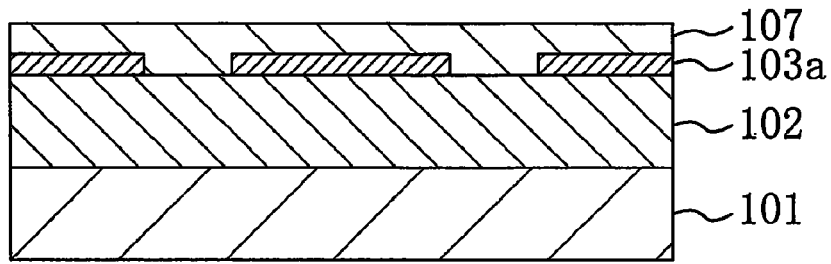
FIG. 3A through FIG. 3D cross-sectionally illustrate steps of the pattern formation method according to embodiment 1 of the present invention.

Then, referring to FIG. 3A, the material for the second resist film is applied on the first intermediate layer pattern 103a to form a second resist film 107 having a thickness of about 0.15 μm.

Figure 3B:
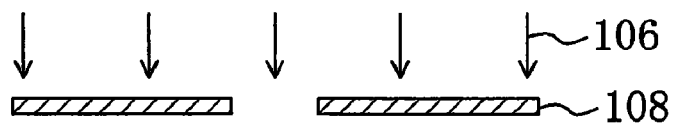
Figure 3B:
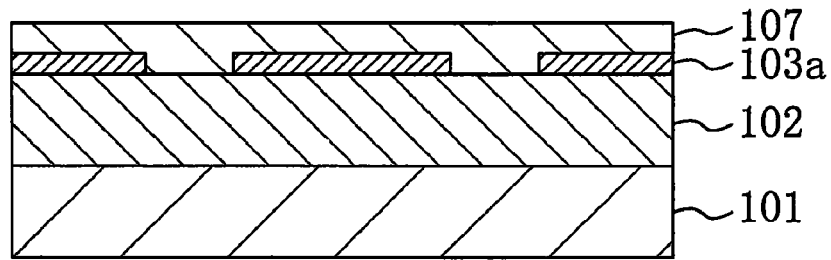

Then, referring to FIG. 3B, the second pattern exposure is carried out with light 106 from the ArF excimer laser having NA of 0.85 via a second photomask 108 having a second pattern. After the second exposure, the second resist film 107 undergoes post-exposure baking with the hotplate at 105° C. for 60 seconds.

Figure 3C:
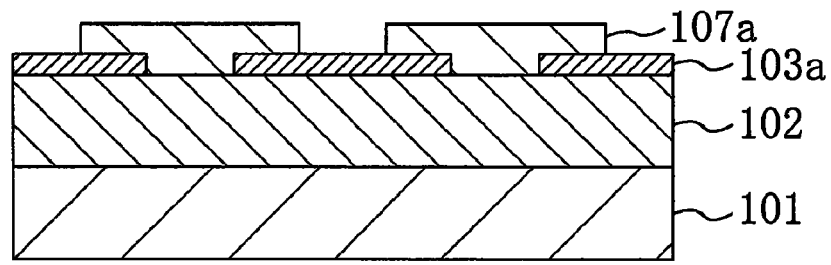

Then, referring to FIG. 3C, the baked second resist film 107 is developed using 2.38 wt % tetramethylammonium hydroxide aqueous solution (alkaline developer) to form a second resist pattern 107a which corresponds to unexposed parts of the second resist film 107.

Figure 3D:
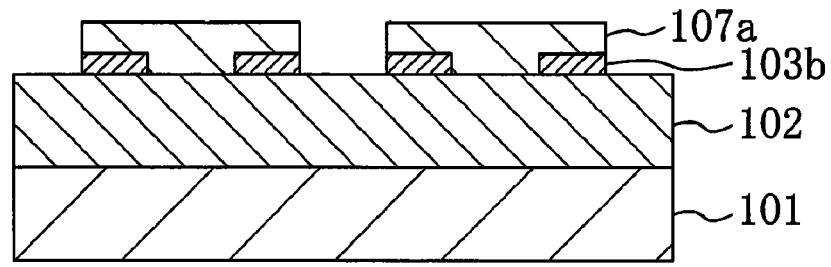
Figure 4A:
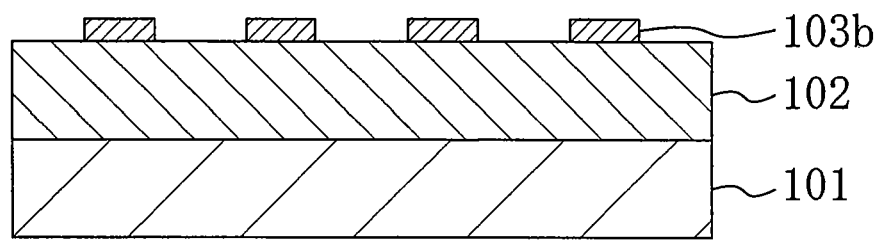
FIG. 4A and FIG. 4B cross-sectionally illustrate steps of the pattern formation method according to embodiment 1 of the present invention.

Then, referring to FIG. 3D, the second resist pattern 107a is used as a mask to etch the first intermediate layer pattern 103a with, for example, a fluoric gas. Referring to FIG. 4A, the second resist pattern 107a is then removed by ashing with oxygen plasma such that a second intermediate layer pattern 103b is formed.

Figure 4B:
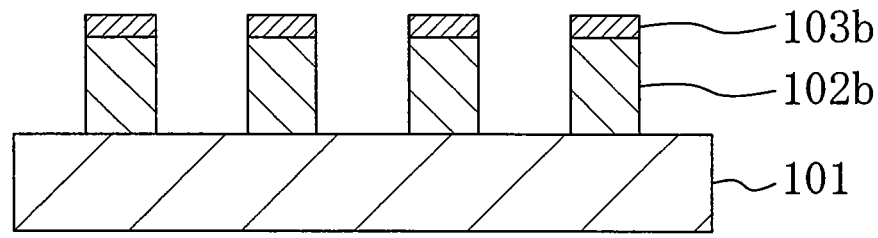

Lastly, referring to FIG. 4B, the second intermediate layer pattern 103b is used as a mask to etch the underlayer film 102 with an oxygen gas, such that an underlayer film pattern 102b which has the first and second pattern is formed.

In the pattern formation method of this embodiment, removing the first resist pattern 104a by ashing causes the first intermediate layer pattern 103a to have a roughened surface and, in the second pattern exposure, part of the acid produced in exposed part of the second resist film 107 is entrapped by the roughened surface, so that the acid is deficient. Since the second resist film 107 however contains a greater amount of photoacid generator than the first resist film 104, the sensitivity of the second resist film 107 is higher so that the deficiency of acid in exposed part of the second resist film 107 can be compensated for by acid produced from the abundantly-contained photoacid generator. Hence, even if the first intermediate layer pattern 103a has a roughened surface due to ashing, the second pattern exposure yields the second resist pattern 107a in substantially the same quality as that in the first pattern exposure. As a result, the finer underlayer film pattern 102b having a desirable shape can finally be obtained.

Herein, the amount of the photoacid generator contained in the second resist film 107 can be optimally determined depending on the other additives contained in the resist, the exposure conditions and other various conditions but preferably corresponds to 110 wt % to 150 wt % of the amount of the photoacid generator contained in the first resist film 104. If less than 110 wt %, compensation for acid would be insufficient so that normal pattern formation sometimes fails. If more than 150 wt %, the acid would become excessive in amount and spread out of the region of exposure so that a pattern of a defective shape is formed.

The photoacid generator can be any one of triphenyl sulfonium trifluoromethanesulfonic acid, triphenyl sulfonium nonafluorobutanesulfonic acid, diphenyl iodonium trifluoromethanesulfonic acid, diphenyl iodonium nonafluorobutanesulfonic acid, (t-butylphenyl) diphenyl sulfonium trifluoromethanesulfonic acid and (t-butylphenyl) diphenyl sulfonium nonafluorobutanesulfonic acid, or any combination thereof.

Figure 5:
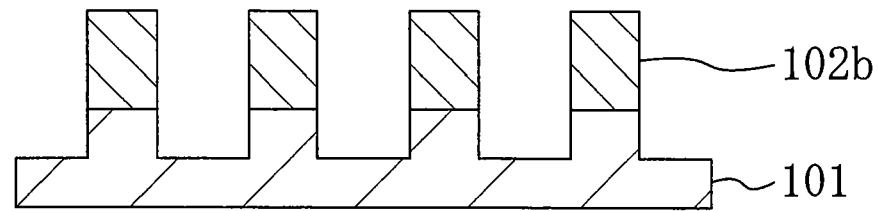
FIG. 5 cross-sectionally illustrates the step of etching a semiconductor substrate using a pattern formed according to the pattern formation method of embodiment 1 of the present invention.

FIG. 5 is a cross-sectional view of a structure resulting from dry etching of the semiconductor substrate 101 (or a film to be etched (not shown) overlying the semiconductor substrate 101) with the underlayer film pattern 102b formed according to this embodiment. With the fine underlayer film pattern 102b having a desirable shape, the semiconductor substrate 101 (or film to be etched) is also microprocessed to have a desirable shape.

It should be noted that, as a matter of course, the underlayer film pattern 102b formed according to the present invention is applicable not only to masks for dry etching but also to masks used in various processes in the manufacture of semiconductor devices (for example, a mask for ion implantation).

According to the present invention, the materials for the underlayer film 102 and the intermediate layer film 103 are not limited to the examples illustrated in this embodiment but, in the pattern formation method based on double patterning with the underlayer film 102/the intermediate layer film 103, can be materials optimally selected according to the materials and exposure conditions for the first and second resist films 104 and 107 or the requirements for subsequent processes which are carried out using the underlayer film pattern 102b formed according to the present invention (e.g., etching, ion implantation, etc.).

Variations of Embodiment 1

In a pattern formation method based on the double patterning of the present invention, a predetermined, abundant amount of photoacid generator is added to the material for the second resist film 107, so that a pattern having a desirable shape can be formed. Moreover, the immersion exposure technique can be employed for further improving the resolution of double patterning.

Figure 6A:
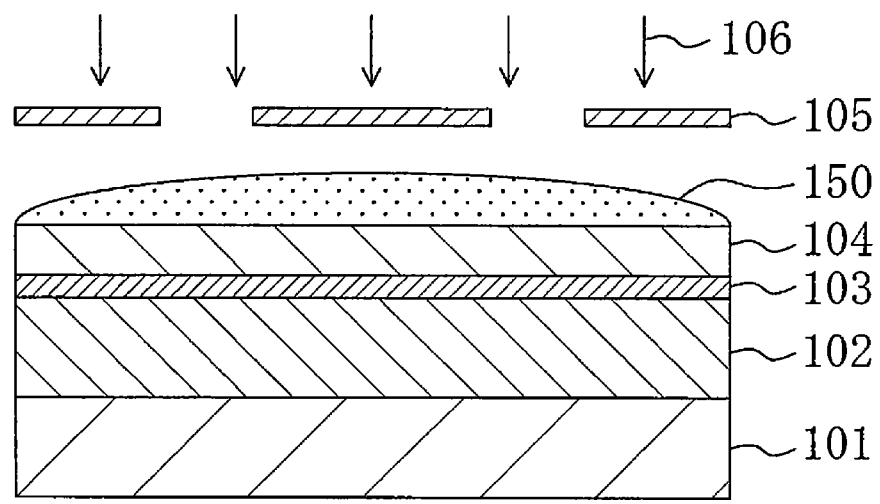
FIG. 6A and FIG. 6B illustrate a variation of embodiment 1 of the present invention.
Figure 6B:
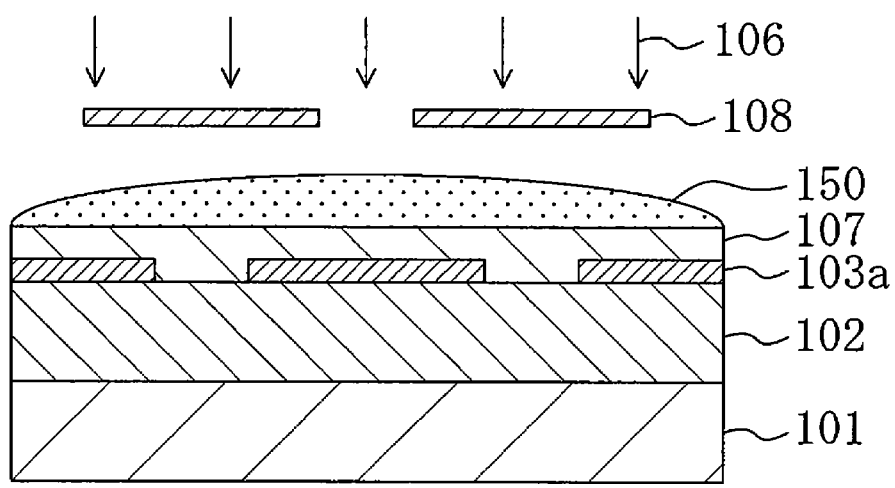

FIG. 6A and FIG. 6B cross-sectionally illustrate the double patterning process described in the above example of embodiment 1 to which the immersion exposure is applied. FIG. 6A illustrates an immersion exposure version of the first resist exposure. FIG. 6B illustrates an immersion exposure version of the second resist exposure.

The cross section of FIG. 6A corresponds to FIG. 2A. Herein, the first pattern exposure is carried out where the first resist film 104 is irradiated with light 106 from the ArF excimer laser via the first photomask 105 and with water 150 provided as liquid for immersion exposure (immersion solution) on the first resist film 104 by, for example, a paddle method.

The cross section of FIG. 6B corresponds to FIG. 3B. Herein, the second pattern exposure is carried out where the second resist film 107 is irradiated with light 106 from the ArF excimer laser via the second photomask 108 and with water as immersion solution 150 provided on the second resist film 107 by the paddle method.

When the immersion exposure technique is thus applied, a space between a lens of the exposure system and the resist film overlying the substrate is filled with liquid (immersion solution) having a refractive index of n. In this case, the NA (numerical aperture) of the exposure system results in n·NA, so that the resolution of the resist is improved. Therefore, a finer pattern having a desirable shape can be formed as compared with conventional exposure techniques.

Herein, the immersion solution 150 can be, for example, water or an acid solution. The acid solution can be, for example, cesium sulfate aqueous solution, phosphoric acid aqueous solution, or the like. The immersion solution 150 may contain an additive, such as a surfactant.

When the immersion exposure technique is applied, the immersion solution 150 provided on the resist films 104 and 107 as shown in FIG. 6A and FIG. 6B can cause a resist component to exude (ooze) out of the resist films 104 and 107 into the immersion solution 150 or, inversely, can cause the immersion solution 150 to permeate (penetrate) into the resist films 104 and 107. In any of these cases, such a phenomenon causes deterioration in lithographic resolution.

Figure 7A:
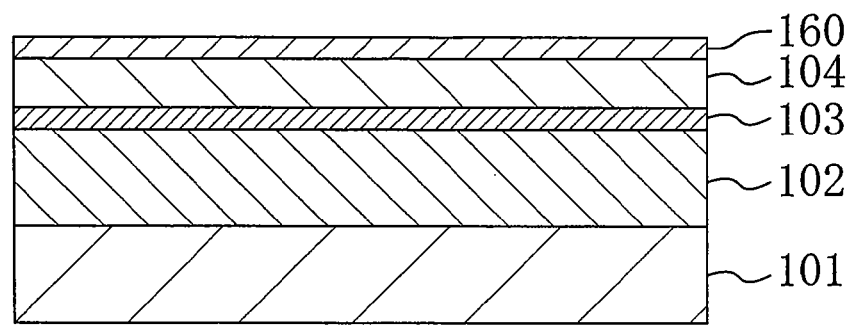
FIG. 7A and FIG. 7B illustrate another variation of embodiment 1 of the present invention.
Figure 7B:
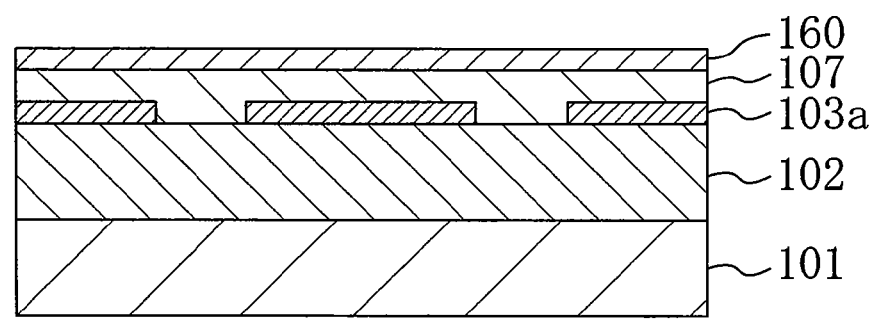
Figure 8A:
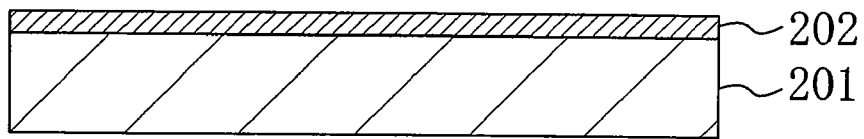
FIG. 8A through FIG. 8D cross-sectionally illustrate steps of a pattern formation method based on the conventional double patterning.
Figure 8B:
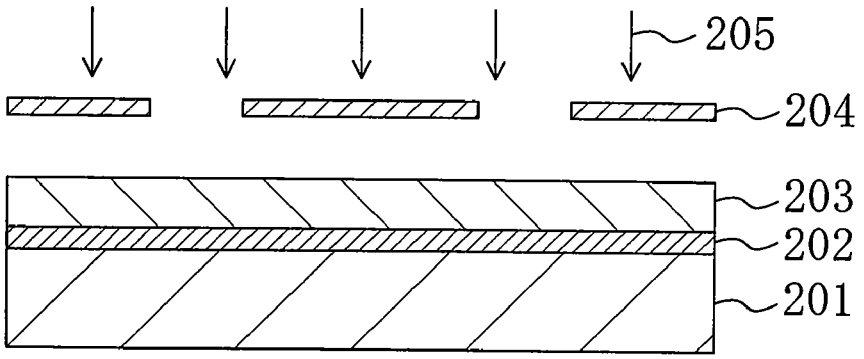
Figure 8C:
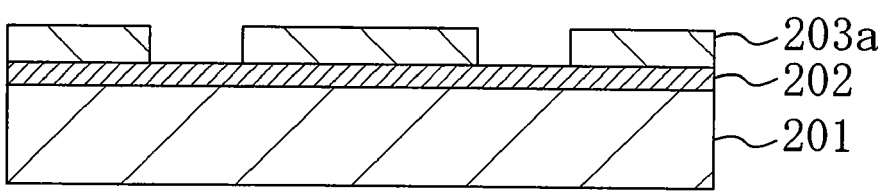
Figure 8D:
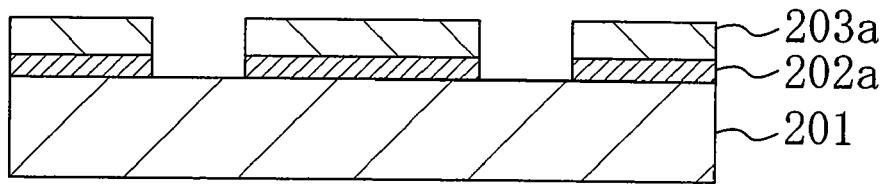
Figure 9A:
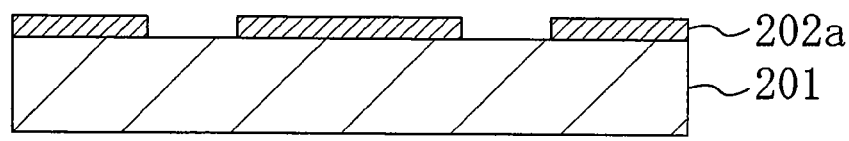
FIG. 9A through FIG. 9D cross-sectionally illustrate steps of the pattern formation method based on the conventional double patterning.
Figure 9B:
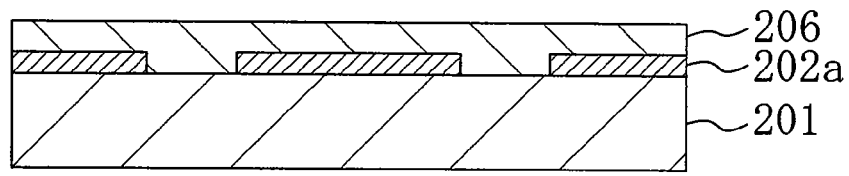
Figure 9C:
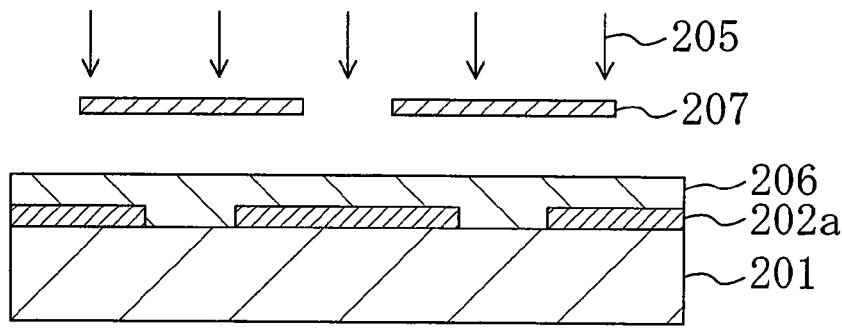
Figure 9D:
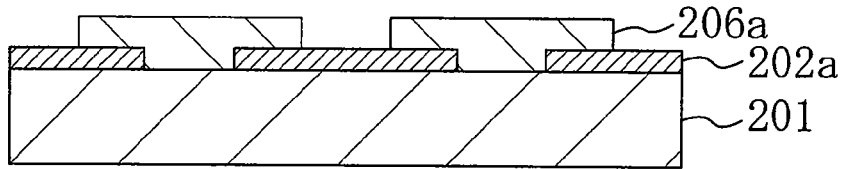
Figure 10A:
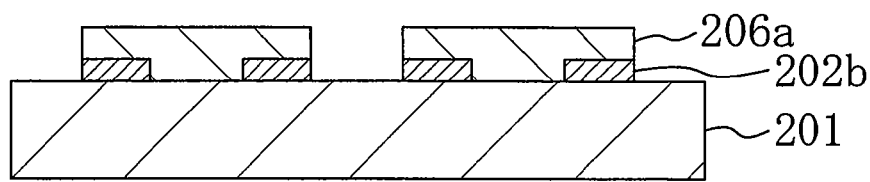
FIG. 10A and FIG. 10B cross-sectionally illustrate steps of the pattern formation method based on the conventional double patterning.
Figure 10B:
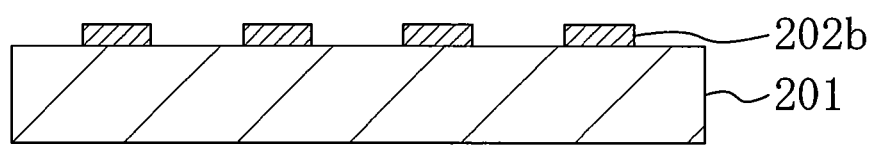
Figure 11:
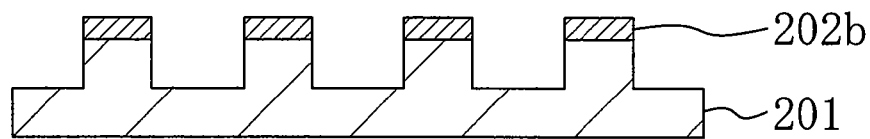
FIG. 11 cross-sectionally illustrates the step of etching a semiconductor substrate using a pattern formed according to the pattern formation method based on the conventional double patterning.
Figure 12:
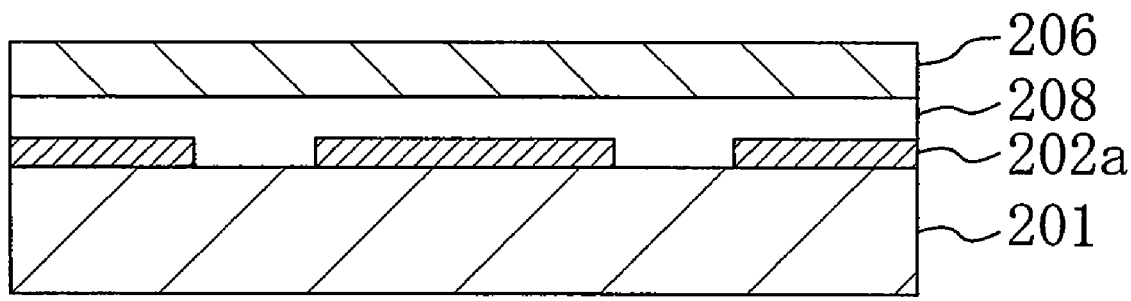
FIG. 12 cross-sectionally illustrates a double patterning method which employs the conventional BARC planarization.
Figure 13A:
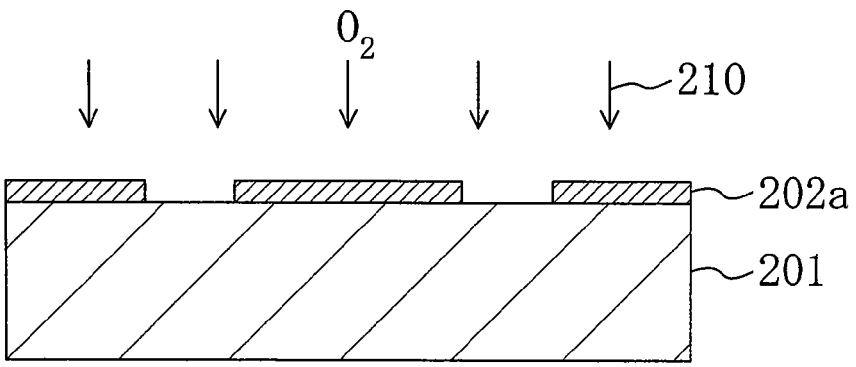
FIG. 13A through FIG. 13C cross-sectionally illustrate the disadvantages in the conventional double patterning.
Figure 13B:
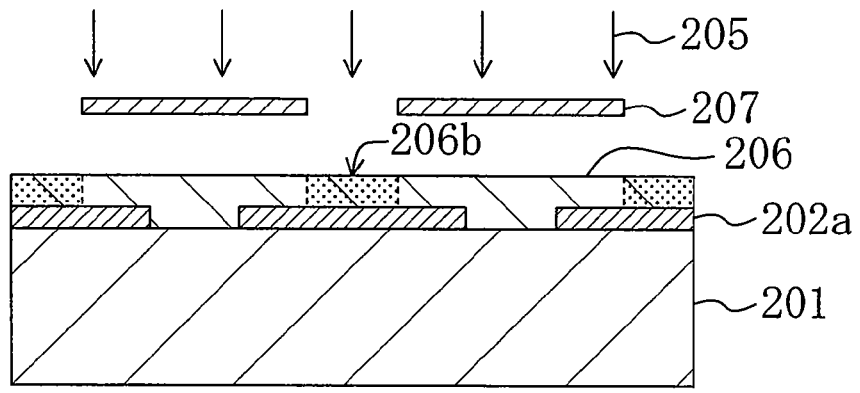
Figure 13C:
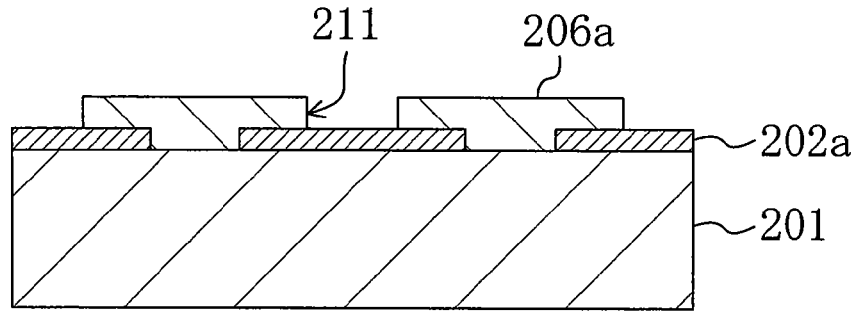

An effective precaution against such a case is to form a barrier film 160 over the resist films 104 and 107 as shown in FIG. 7A and FIG. 7B. The cross section of FIG. 7A corresponds to FIG. 1C, where the first resist film 104 is coated with the barrier film 160 having a thickness of about 0.1 μm. This structure is subjected to the immersion exposure as illustrated in FIG. 6A. The cross section of FIG. 7B corresponds to FIG. 3A, where the second resist film 107 is coated with the barrier film 160 having a thickness of about 0.1 μm. This structure is subjected to the immersion exposure as illustrated in FIG. 6B.

Herein, the barrier film can be made of, for example, an alkaline-soluble material containing fluorine. After the formation of the barrier film 160, the resultant structure may be heated by a hotplate to 120° C. for about 90 seconds for the purpose of improving the denseness of the barrier film 160. If the denseness of the barrier film 160 is excessively improved, the barrier film 160 would become difficult to dissolve. Thus, the barrier film 160 is preferably heated to an appropriate temperature. The appropriate temperature for improving the denseness of the barrier film 160 is, for example, in the range of 100° C. to 150° C.

As a matter of course, the above-described immersion exposure and formation of the barrier film 160 may be applied to both of or any one of the first and second pattern exposures.

Embodiment 2

In embodiment 2, the amount of base which functions as a quencher for the photoacid generator contained in the second resist film 107 is adjusted such that the same effects as those of embodiment 1 are achieved, though in embodiment 1 a predetermined, abundant amount of photoacid generator is contained in the second resist film 107 such that occurrence of a pattern error due to the roughened surface of the first intermediate layer pattern 103a is prevented.

A pattern formation method of embodiment 2 is realized in the same way as the method described in embodiment 1 and is therefore described while referring again to FIGS. 1A to 1C, FIGS. 2A to 2D, FIGS. 3A to 3D, and FIGS. 4A and 4B. It should be noted that the same functions and structures as those of embodiment 1 are not described again in detail in this section.

First, the material for the first resist film having the following composition is prepared.

| | |
|---|---|
| Poly(2-methyl-2-adamantyl methacrylate (50 mol %)-γ-butyrolactone methacrylate (40 mol %)-2-hydroxy adamantane methacrylate (10 mol %)) (base polymer) | 2 g |
| Triphenyl sulfonium trifluoromethanesulfonic acid (photoacid generator) | 0.06 g |
| Triethanolamine (quencher) | 0.002 g |
| Propylene glycol monomethyl ether acetate (solvent) | 20 g |

Also, the material for the second resist film having the following composition is prepared.

| | |
|---|---|
| Poly(2-methyl-2-adamantyl methacrylate (50 mol %)-γ-butyrolactone methacrylate (40 mol %)-2-hydroxy adamantane methacrylate (10 mol %)) (base polymer) | 2 g |
| Triphenyl sulfonium trifluoromethanesulfonic acid (photoacid generator) | 0.06 g |
| Triethanolamine (quencher) | 0.0018 g |
| Propylene glycol monomethyl ether acetate (solvent) | 20 g |

Herein, the amount of the quencher (base) contained in the material for the second resist film is smaller than in the material for the first resist film.

First, referring to FIG. 1A, an underlayer film 102 is formed on a semiconductor substrate 101 so as to have a thickness of about 0.7 μm. Then, referring to FIG. 1B, an intermediate layer film 103 is formed on the underlayer film 102 so as to have a thickness of about 0.08 μm.

Then, referring to FIG. 1C, the material for the first resist film is applied on the intermediate layer film 103 to form a first resist film 104 having a thickness of about 0.15 μm.

Then, referring to FIG. 2A, the first pattern exposure is carried out with light 106 from an ArF excimer laser having NA of 0.85 via a first photomask 105 having a first pattern. After the first exposure, the first resist film 104 is heated by a hotplate to 105° C. for 60 seconds (post-exposure baking).

Then, referring to FIG. 2B, the baked first resist film 104 is developed using 2.38 wt % tetramethylammonium hydroxide aqueous solution (alkaline developer) to form a first resist pattern 104a which corresponds to unexposed parts of the first resist film 104.

Then, referring to FIG. 2C, the first resist pattern 104a is used as a mask to etch the intermediate layer film 103 with, for example, a fluoric gas. Referring to FIG. 2D, the first resist pattern 104a is then removed by ashing with oxygen plasma such that a first intermediate layer pattern 103a is formed.

Then, referring to FIG. 3A, the material for the second resist film is applied on the first intermediate layer pattern 103a to form a second resist film 107 having a thickness of about 0.15 μm.

Then, referring to FIG. 3B, the second pattern exposure is carried out with light 106 from the ArF excimer laser having NA of 0.85 via a second photomask 108 having a second pattern. After the second exposure, the second resist film 107 undergoes post-exposure baking with the hotplate at 105° C. for 60 seconds.

Then, referring to FIG. 3C, the baked second resist film 107 is developed using 2.38 wt % tetramethylammonium hydroxide aqueous solution (alkaline developer) to form a second resist pattern 107a which corresponds to unexposed parts of the second resist film 107.

Then, referring to FIG. 3D, the second resist pattern 107a is used as a mask to etch the first intermediate layer pattern 103a with, for example, a fluoric gas. Referring to FIG. 4A, the second resist pattern 107a is then removed by ashing with oxygen plasma such that a second intermediate layer pattern 103b is formed.

Lastly, referring to FIG. 4B, the second intermediate layer pattern 103b is used as a mask to etch the underlayer film 102 with an oxygen gas, such that an underlayer film pattern 102b which has the first and second pattern is formed.

In the pattern formation method of this embodiment, removing the first resist pattern 104a by ashing causes the first intermediate layer pattern 103a to have a roughened surface and, in the second pattern exposure, part of the acid produced in exposed part of the second resist film 107 is entrapped by the roughened surface, so that the acid is deficient. Since the second resist film 107 however contains a smaller amount of quencher (base) than the first resist film 104, the sensitivity of the second resist film 107 is relatively high so that the deficiency of acid in exposed part of the second resist film 107 can be indirectly compensated for by the inadequately-contained base. Hence, even if the first intermediate layer pattern 103a has a roughened surface due to ashing, the second pattern exposure yields the second resist pattern 107a in substantially the same quality as that in the first pattern exposure. As a result, the finer underlayer film pattern 102b having a desirable shape can finally be obtained.

Herein, the amount of the quencher (base) contained in the second resist film 107 can be optimally determined depending on the other additives contained in the resist, the exposure conditions and other various conditions but preferably corresponds to 50 wt % to 90 wt % of the amount of the base contained in the first resist film 104. If more than 90 wt %, the amount of acid would be smaller so that normal pattern formation can fail. If less than 50 wt %, the acid would become excessive in amount and spread out of the region of exposure so that a pattern of a defective shape can be formed.

The quencher (base) can be any one of triethanolamine, triethylamine, trimethanolamine, trimethylamine, triisopropanolamine, triisopropylamine, tri-t-butanolamine, tri-t-butylamine, tri-n-butanolamine, tri-n-butylamine, diethanolamine, diethylamine, dimethanolamine, dimethylamine, diisopropanolamine, diisopropylamine, di-t-butanolamine, di-t-butylamine, di-n-butanolamine, di-n-butylamine, ethanolamine, ethylamine, methanolamine, methylamine, isopropanolamine, isopropylamine, t-butanolamine, t-butylamine, n-butanolamine, and n-butylamine, or any combination thereof.

Also in embodiment 2, as a matter of course, the above-described immersion exposure and/or formation of the barrier film described as for the variations of embodiment 1 can be applied to the first and/or second pattern exposures.

Embodiment 3

In embodiment 3, the second resist film 107 contains 2-nitrobenzyl ether whereas the first resist film 104 does not contain 2-nitrobenzyl ether such that the same effects as those of embodiments 1 and 2 are achieved, though in embodiments 1 and 2 the second resist film 107 has a higher sensitivity than the first resist film 104 so that occurrence of a pattern error due to the roughened surface of the first intermediate layer pattern 103a is prevented.

A pattern formation method of embodiment 3 is realized in the same way as the method described in embodiment 1 and is therefore described while referring again to FIGS. 1A to 1C, FIGS. 2A to 2D, FIGS. 3A to 3D, and FIGS. 4A and 4B. It should be noted that the same functions and structures as those of embodiment 1 are not described again in detail in this section.

First, the material for the first resist film having the following composition is prepared.

| | |
|---|---|
| Poly(2-methyl-2-adamantyl methacrylate (50 mol %)-γ-butyrolactone methacrylate (40 mol %)-2-hydroxy adamantane methacrylate (10 mol %)) (base polymer) | 2 g |
| Triphenyl sulfonium trifluoromethanesulfonic acid (photoacid generator) | 0.06 g |
| Triethanolamine (quencher) | 0.002 g |
| Propylene glycol monomethyl ether acetate (solvent) | 20 g |

Also, the material for the second resist film having the following composition is prepared.

| | |
|---|---|
| Poly(2-methyl-2-adamantyl methacrylate (50 mol %)-γ-butyrolactone methacrylate (40 mol %)-2-hydroxy adamantane methacrylate (10 mol %)) (base polymer) | 2 g |
| Triphenyl sulfonium trifluoromethanesulfonic acid (photoacid generator) | 0.06 g |
| Triethanolamine (quencher) | 0.002 g |
| 2-nitrobenzyl t-butyl ether | 0.5 g |
| Propylene glycol monomethyl ether acetate (solvent) | 20 g |

Herein, the material for the second resist film contains 2-nitrobenzyl t-butyl ether, whereas the material for the first resist film does not contain 2-nitrobenzyl t-butyl ether.

First, referring to FIG. 1A, an underlayer film 102 is formed on a semiconductor substrate 101 so as to have a thickness of about 0.7 µm. Then, referring to FIG. 1B, an intermediate layer film 103 is formed on the underlayer film 102 so as to have a thickness of about 0.08 µm.

Then, referring to FIG. 1C, the material for the first resist film is applied on the intermediate layer film 103 to form a first resist film 104 having a thickness of about 0.15 µm.

Then, referring to FIG. 2A, the first pattern exposure is carried out with light 106 from an ArF excimer laser having NA of 0.85 via a first photomask 105 having a first pattern. After the first exposure, the first resist film 104 is heated by a hotplate to 105° C. for 60 seconds (post-exposure baking).

Then, referring to FIG. 2B, the baked first resist film 104 is developed using 2.38 wt % tetramethylammonium hydroxide aqueous solution (alkaline developer) to form a first resist pattern 104a which corresponds to unexposed parts of the first resist film 104.

Then, referring to FIG. 2C, the first resist pattern 104a is used as a mask to etch the intermediate layer film 103 with, for example, a fluoric gas. Referring to FIG. 2D, the first resist pattern 104a is then removed by ashing with oxygen plasma such that a first intermediate layer pattern 103a is formed.

Then, referring to FIG. 3A, the material for the second resist film is applied on the first intermediate layer pattern 103a to form a second resist film 107 having a thickness of about 0.15 µm.

Then, referring to FIG. 3B, the second pattern exposure is carried out with light 106 from the ArF excimer laser having NA of 0.85 via a second photomask 108 having a second pattern. After the second exposure, the second resist film 107 undergoes post-exposure baking with the hotplate at 105° C. for 60 seconds.

Then, referring to FIG. 3C, the baked second resist film 107 is developed using 2.38 wt % tetramethylammonium hydroxide aqueous solution (alkaline developer) to form a second resist pattern 107a which corresponds to unexposed parts of the second resist film 107.

Then, referring to FIG. 3D, the second resist pattern 107a is used as a mask to etch the first intermediate layer pattern 103a with, for example, a fluoric gas. Referring to FIG. 4A, the second resist pattern 107a is then removed by ashing with oxygen plasma such that a second intermediate layer pattern 103b is formed.

Lastly, referring to FIG. 4B, the second intermediate layer pattern 103b is used as a mask to etch the underlayer film 102 with an oxygen gas, such that an underlayer film pattern 102b which has the first and second pattern is formed.

In the pattern formation method of this embodiment, removing the first resist pattern 104a by ashing causes the first intermediate layer pattern 103a to have a roughened surface and, in the second pattern exposure, part of the acid produced in exposed part of the second resist film 107 is entrapped by the roughened surface, so that the acid is deficient. Since the second resist film 107 however contains 2-nitrobenzyl ether, OH-base produced by exposure from 2-nitrobenzyl ether improves the alkaline solubility. Thus, the relatively deteriorated alkaline solubility of the second resist film 107 is ameliorated. Hence, even if the first intermediate layer pattern 103a has a roughened surface due to ashing, the second pattern exposure yields the second resist pattern 107a in substantially the same quality as that in the first pattern exposure. As a result, the finer underlayer film pattern 102b having a desirable shape can finally be obtained.

Herein, the amount of 2-nitrobenzyl ether contained in the second resist film 107 can be optimally determined depending on the other additives contained in the resist, the exposure conditions and other various conditions but preferably corresponds to 10 wt % to 30 wt % of the amount of the base polymer which is a constituent of the second resist film 107. If less than 10 wt %, the amount of OH base produced would be relatively small and improvement in alkaline solubility of the exposed parts is insufficient so that normal pattern formation can fail. If more than 30 wt %, the amount of OH base would be relatively abundant so that a portion of the unexposed parts can be dissolved to form a pattern of a defective shape.

Herein, 2-nitrobenzyl ether is not limited to aforementioned 2-nitrobenzyl t-butyl ether but may be any one of 2-nitrobenzyl isopropyl ether, 2-nitrobenzyl trifluoromethyl ether and 2-nitrobenzyl nonafluorobutyl ether, or any combination thereof.

Also in embodiment 3, as a matter of course, the above-described immersion exposure and/or formation of the barrier film described as for the variations of embodiment 1 can be applied to the first and/or second pattern exposures.

Thus, the present invention has been described with its preferable embodiments and examples, but such disclosures are non-limiting and, as a matter of course, can be variously modified. For example, the present invention is not limited to using the ArF excimer laser light for resist exposure as described in the above embodiments, but KrF excimer laser light, $Xe_2$ laser light, $F_2$ laser light, KrAr laser light, $Ar_2$ laser light, or the like, may be used instead. The pattern error due to the roughened surface of the first intermediate layer pattern 103a described in embodiment 2 is a common problem which is also encountered by the double patterning with conventional hardmask. The countermeasures described above in the embodiments are applicable to the double patterning with conventional hardmask.

What is claimed is:
1. A pattern formation method, comprising the steps of:
 (a) forming an underlayer film on a film to be etched;
 (b) forming an intermediate layer film on the underlayer film;
 (c) forming a first resist film on the intermediate layer film and performing exposure and development of the first resist film via a first photomask having a first pattern to form a first resist pattern;
 (d) etching the intermediate layer film using the first resist pattern as a mask to transfer the first resist pattern into the intermediate layer so as to form a first intermediate layer pattern which has the first pattern;
(e) removing the first resist pattern;
(f) after step (e), forming a second resist film on the underlayer film and the first intermediate layer pattern and performing exposure and development of the second resist film via a second photomask having a second pattern to form a second resist pattern;
(g) etching the first intermediate layer pattern using the second resist pattern as a mask to transfer the second resist pattern into the first intermediate layer pattern so as to form a second intermediate layer pattern which has a composite pattern of the first and the second pattern;
(h) removing the second resist pattern; and
(i) after step (h), etching the underlayer film using the second intermediate layer pattern as a mask to form an underlayer pattern which has the composite pattern,
wherein the first resist film and the second resist film are chemically amplified resist films,
at least one of an additive which improves sensitivity of the resist and an additive which improves alkaline solubility of exposed part of the resist is contained in a greater amount in the second resist film than in the first resist film,
the underlayer pattern is used as a mask for dry etching the film to be etched, and
in the step (f), the second resist film is formed on a surface portion of the underlayer film which is opposite to a surface in contact with the film to be etched and on a surface portion of the first intermediate layer pattern which is opposite to a surface in contact with the underlayer film.

2. The pattern formation method of claim 1, wherein:
the first resist film and the second resist film contain a photoacid generator as an additive; and
the second resist film contains a greater amount of the photoacid generator than the first resist film.

3. The pattern formation method of claim 2, wherein the amount of the photoacid generator contained in the second resist film corresponds to 110 wt % to 150 wt % of the amount of the photoacid generator contained in the first resist film.

4. The pattern formation method of claim 2, wherein the photoacid generator includes one or more selected from the group consisting of triphenyl sulfonium trifluoromethanesulfonic acid, triphenyl sulfonium nonafluorobutanesulfonic acid, diphenyl iodonium trifluoromethanesulfonic acid, diphenyl iodonium nonafluorobutanesulfonic acid, (t-butylphenyl) diphenyl sulfonium trifluoromethanesulfonic acid, and (t-butylphenyl) diphenyl sulfonium nonafluorobutanesulfonic acid.

5. The pattern formation method of claim 1, wherein:
the first resist film and the second resist film contain a base as an additive; and
the second resist film contains a smaller amount of the base than the first resist film.

6. The pattern formation method of claim 5, wherein the amount of base contained in the second resist film corresponds to 50 wt % to 90 wt % of the amount of the base contained in the first resist film.

7. The pattern formation method of claim 5, wherein the base includes one or more selected from the group consisting of triethanolamine, triethylamine, trimethanolamine, trimethylamine, triisopropanolamine, triisopropylamine, tri-t-butanolamine, tri-t-butylamine, tri-n-butanolamine, tri-n-butylamine, diethanolamine, diethylamine, dimethanolamine, dimethylamine, diisopropanolamine, diisopropylamine, di-t-butanolamine, di-t-butylamine, di-n-butanolamine, di-n-butylamine, ethanolamine, ethylamine, methanolamine, methylamine, isopropanolamine, isopropylamine, t-butanolamine, t-butylamine, n-butanolamine, and n-butylamine.

8. The pattern formation method of claim 1, wherein the second resist film contains 2-nitrobenzyl ether while the first resist film does not contain 2-nitrobenzyl ether.

9. The pattern formation method of claim 8, wherein the amount of 2-nitrobenzyl ether contained in the second resist film corresponds to 10 wt % to 30 wt % of a base polymer which is a constituent of the second resist film.

10. The pattern formation method of claim 8, wherein the 2-nitrobenzyl ether includes one or more of the group consisting of 2-nitrobenzyl t-butyl ether, 2-nitrobenzyl isopropyl ether, 2-nitrobenzyl trifluoromethyl ether, and 2-nitrobenzyl nonafluorobutyl ether.

11. The pattern formation method of claim 1, wherein at least one of step (c) and step (f) includes performing an immersion exposure with a liquid provided on the first resist film or the second resist film.

12. The pattern formation method of claim 11, further comprising the step of forming a barrier film on the first resist film or the second resist film before the immersion exposure.

13. The pattern formation method of claim 11, wherein the liquid is water or an acid solution.

14. The pattern formation method of claim 13, wherein the acid solution is a cesium sulfate aqueous solution or phosphoric acid aqueous solution.

15. The pattern formation method of claim 1, wherein the step (a) includes the step of (a1) applying a material containing a first resin.

16. The pattern formation method of claim 15, wherein the material containing the first resin includes a resin having a hydrocarbon skeleton, a crosslinking agent, and a thermal acid generator.

17. The pattern formation method of claim 16, wherein the step (a) includes the step of (a2) heating the material containing the first resin after the step (a1).

18. The pattern formation method of claim 1, wherein the intermediate layer film is made of a material containing silicon.

19. The pattern formation method of claim 18, wherein the material containing silicon has $SiO_2$ skeleton, SiN skeleton, and SiON skeleton.

20. The pattern formation method of claim 19, wherein the material containing silicon is a siloxane resin or a silsesquioxane resin.

* * * * *